(12) United States Patent
Master et al.

(10) Patent No.: US 6,722,553 B2
(45) Date of Patent: Apr. 20, 2004

(54) CONTROLLED AND PROGRAMMED DEPOSITION OF FLUX ON A FLIP-CHIP DIE BY SPRAYING

(75) Inventors: Raj N. Master, San Jose, CA (US); Mohammad Z. Khan, San Jose, CA (US); Maria G. Guardado, San Jose, CA (US); Ooi Tong Ong, Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/922,936

(22) Filed: Aug. 7, 2001

(65) Prior Publication Data

US 2002/0031861 A1 Mar. 14, 2002

Related U.S. Application Data

(60) Provisional application No. 60/227,285, filed on Aug. 24, 2000.

(51) Int. Cl.$^7$ ............... B23K 13/08; B23K 1/00; B23K 5/00; B23K 20/08
(52) U.S. Cl. ............... 228/33; 228/8; 228/11
(58) Field of Search ............... 228/33, 8, 11, 228/45; 438/108

(56) References Cited

U.S. PATENT DOCUMENTS

| | | | | | |
|---|---|---|---|---|---|
| 3,741,150 A | * | 6/1973 | Napor et al. | ............... | 118/302 |
| 4,848,641 A | * | 7/1989 | Park et al. | ............... | 228/37 |
| 4,934,307 A | * | 6/1990 | Sumiyoshi | ............... | 118/74 |
| 5,065,692 A | * | 11/1991 | Hollesen et al. | ............... | 118/302 |
| 5,074,455 A | * | 12/1991 | Peana et al. | ............... | 228/35 |
| 5,226,962 A | * | 7/1993 | Burke et al. | ............... | 118/314 |
| 5,266,113 A | * | 11/1993 | Konno | ............... | 118/74 |
| 5,328,085 A | * | 7/1994 | Stoops et al. | ............... | 228/33 |
| 5,560,537 A | * | 10/1996 | Sadler et al. | ............... | 228/102 |
| 5,615,828 A | * | 4/1997 | Stoops | ............... | 118/313 |
| 5,747,102 A | * | 5/1998 | Smith et al. | ............... | 427/96 |
| 5,989,638 A | * | 11/1999 | Nielsen | ............... | 427/331 |
| 6,098,867 A | * | 8/2000 | Master et al. | ............... | 228/102 |
| 6,164,516 A | * | 12/2000 | Watanabe et al. | ............... | 228/37 |
| 6,253,957 B1 | * | 7/2001 | Messerly et al. | ............... | 222/1 |
| 6,265,017 B1 | * | 7/2001 | Hogan et al. | ............... | 427/8 |
| 6,399,902 B1 | * | 6/2002 | Brownfield et al. | ............... | 177/60 |

FOREIGN PATENT DOCUMENTS

| | | |
|---|---|---|
| DE | 4406766 A1 | 9/1994 |
| EP | 0815999 A1 | 1/1998 |
| FR | 2683114 A | 4/1993 |

OTHER PUBLICATIONS

WO 99/48141, Master et al, Sep. 1999, p. 10 line 15—p. 12 line 11.*

* cited by examiner

Primary Examiner—Tom Dunn
Assistant Examiner—Colleen P. Cooke

(57) ABSTRACT

A method and apparatus are provided for controllably dispensing flux on a substrate having a plurality of conductive terminals. Flux having a viscosity range between 10 centipoises and about 150 centipoises is sprayed on the substrate and the conductive terminals at a valve pressure range between about 1.5 psi and about 30 psi via a dispense nozzle of a flux dispenser. Upon a subsequent high temperature solder reflow process, the sprayed flux on the substrate is mostly removed by thermal decomposition to volatile species, thereby significantly reducing flux residue remaining on the surface of the substrate between the conductive terminals.

10 Claims, 5 Drawing Sheets

CONTROLLED AND PROGRAMMED DEPOSITION OF FLUX ON A FLIP-CHIP DIE BY SPRAYING

RELATED APPLICATIONS

This application claims priority from U.S. Provisional Patent Application Ser. No. 60/227,285, filed Aug. 24, 2000.

FIELD OF THE INVENTION

The present invention relates to semiconductor packaging technology, and more particularly to flip-chip and related chip scale semiconductor packaging technology.

BACKGROUND OF THE INVENTION

A common task in the manufacture of microelectronic components involves the manufacture of single chip or multi-chip modules having input/output pins which are inserted into a substrate. The input/output pins provide the needed electrical connections to the integrated circuit chip or chips, which are subsequently connected to the substrate or carrier. In other presently known manufacturing processes, a chip is soldered directly to a printed circuit board. With either process, solder flux compositions have typically been applied to the pins in order to connect the component to the selected substrate, for instance, the printed circuit board.

As electronic devices become smaller and more dense, greater demand is placed on the ability to establish efficient, reliable interconnections from a semiconductor chip to a substrate. There are at least three well-known methods for interconnecting chips to substrate. Those three methods are (a) face-up wire bonding, (b) face-up tape-automated bonding, and (c) the flip-chip method. Among these three methods, the flip-chip methods is frequently chosen as a preferred method of semiconductor packaging for it allows the interconnection of high density devices having a large number of input and output paths. Also, the flip-chip method provides short conductivity leads from the chip to the substrate, a small device footprint, low inductance, high frequency capabilities, and good noise control.

As shown in FIG. 1B, a flip-chip is a semiconductor chip 10 that is mounted onto a substrate 18 with the surface of the chip 10 facing the substrate 18. Although several materials may be used to form an interconnection between the flip-chip 10 and substrate 18, solder is one of the more commonly employed materials for flip-chip bumps 12. In the solder interconnect process termed "controlled-collapse chip connection "(C4)", the solder bumps 12 are deposited on a wettable conductive terminal on the semiconductor chip 10. Then the semiconductor chip 10 is aligned with the substrate 18 so that the solder bumps 12 are directly over solder wettable terminals 20 of the substrate 18. The solder bump are then tacked to the substrate 18 and reflowed in the presence of solder flux, creating an electrical and mechanical connection from the chip 10 to the substrate 18 as well as a path for heat dissipation.

Typically, the chip-substrate joining process involves application of a flux on the chip 10 and/or the solder wettable terminals 20 of the substrate 18. As shown in FIG. 1A, flux 16 is manually brushed over the entire surface of the semiconductor chip 10 by a brush 14, including the previously formed flip-chip bumps 12. For the purpose of increasing cleaning efficiency, Low-solid fluxes, or "no-clean fluxes", which contain small amounts, e.g., about 1% to 5% by weight of solids (activator and vehicle) and the remainder liquid solvent, such as isopropyl alcohol, are being increasingly used by circuit board manufacturers in an effort to eliminate the need to clean the circuit boards after soldering. Because of the small amount of solids within no-clean fluxes, the amount of residue left on the board is significantly reduced, as compared to the amount of residue remaining after the use of conventional rosin-based fluxes. These low-solid, no clean fluxes are particularly attractive because, as their name implies, flux cleaning of the circuit boards after soldering is not required, which results in a significant cost savings.

After flux application, the chip 10 is aligned to the substrate 18 having the flip-chip pads 20 on its surface, which is further facilitated by the flux viscosity and tackiness. The chip-substrate assembly is then subjected to solder reflow in a furnace under nitrogen or forming gas. In the subsequent cooling cycle of the thermal profile for joining, the solder hardens and at the same time, the residual flux vapors deposit on the various exposed surfaces.

Under the high temperature solder reflow environment, the flux is mostly removed by thermal decomposition to volatile species but a small fraction of these thermally activated species undergoes crosslinking reactions, resulting in resinous/carbonaceous byproducts as residue 22 (FIG. 1B) on the C4 connections and all other surfaces on the chip 10 and the substrate 18 that are exposed to the volatile species during the solder reflow professing. The flux residue 22 must be removed from all critical surfaces prior to further operation, otherwise it can lead to function failure during long term use due to stress corrosion during the exposure to temperature and humidity environment. Further need for removal of flux residue is dictated by the observation that if any residual film of flux residue remains on the substrate or device surface material, it causes detriment to the adhesion of C4 epoxy encapsulant or underfill which is required for enhanced C4 fatigue life and C4 reliability during production on-off cycles.

Therefore, there exists a need for improved and production worthy methodology which reduces flux residue from all critical surfaces.

SUMMARY OF THE INVENTION

These and other needs are met by the present invention which provides a method for depositing flux on a substrate having a plurality of conductive terminals to reduce flux residue from all critical areas of a chip surface. The present invention also provides an apparatus for dispensing flux on a substrate having conductive terminals to reduce flux residue from all critical areas of a chip surface.

The method in accordance with the present invention includes positioning a substrate having a plurality of conductive terminals on a predetermined location. Subsequently, flux having a viscosity range between about 10 centipoises and about 150 centipoises is controllably sprayed on the substrate at a valve pressure range between about 1.5 psi and about 30 psi to deposit the flux on the plurality of conductive terminals. In certain embodiments of the present invention, a flux dispenser equipped with a flux needle and containing the flux is used to deposit the flux on the substrate and the conductive terminals thereon.

The apparatus in accordance with the present invention comprises a flux fluid chamber containing flux having a viscosity range between about 10 centipoises and about 150 centipoises, and a flux dispense nozzle connected to the flux fluid and spraying the flux at a valve pressure range between about 1.5 psi and about 30 psi to deposit the flux on the plurality of conductive terminals. In certain embodiment of the present invention, the flux needle is used as the flux-dispensing nozzle.

Hence, the flux having a viscosity range between about 10 centipoises and about 150 centipoises is controllably sprayed on the substrate at a valve pressure range between about 1.5 psi and about 30 psi to deposit the flux on the substrate and the conductive terminals thereon. This has an advantage of significantly reducing flux residue remaining on the substrate after the high temperature solder reflow process, since the flux is mostly removed by thermal decomposition to volatile species during the high temperature solder reflow process. Thus, the present invention reduces the risk of the device's functional failure during long-term use due to stress corrosion caused by exposure to temperature and humidity, thus achieving enhanced C4 fatigue life and reliability during production on-off cycle.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE EXEMPLARY EMBODIMENTS

The method and apparatus described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of a semiconductor chip or a substrate during fabrication are not drawn to scale, but instead are drawn to illustrate the feature of the present invention.

In accordance with certain embodiments of the present invention, methods are provided that substantially reduce flux residue on the surface of a semiconductor chip or surface after a high temperature solder reflow process. As part of the invention, it was recognized that flux is mostly removed by thermal decomposition to volatile species under the high temperature solder reflow environment, but a small fraction of these thermally activated species undergoes crosslinking reactions, resulting in resinous/carbonaceous byproducts as residue on the surface on the chip and the substrate, which increases the risk of the device's functional failure and negatively impacts flip-chip interconnection device life and reliability. Thus, in accordance with the present invention, flux having a specific viscosity range is controllably dispensed over a chip or a substrate at a specific valve pressure range to significantly reduce the flux residue after the high temperature solder reflow environment. Since flux residue is significantly reduced, the flux residue problems are also significantly reduced.

Figure 1A:
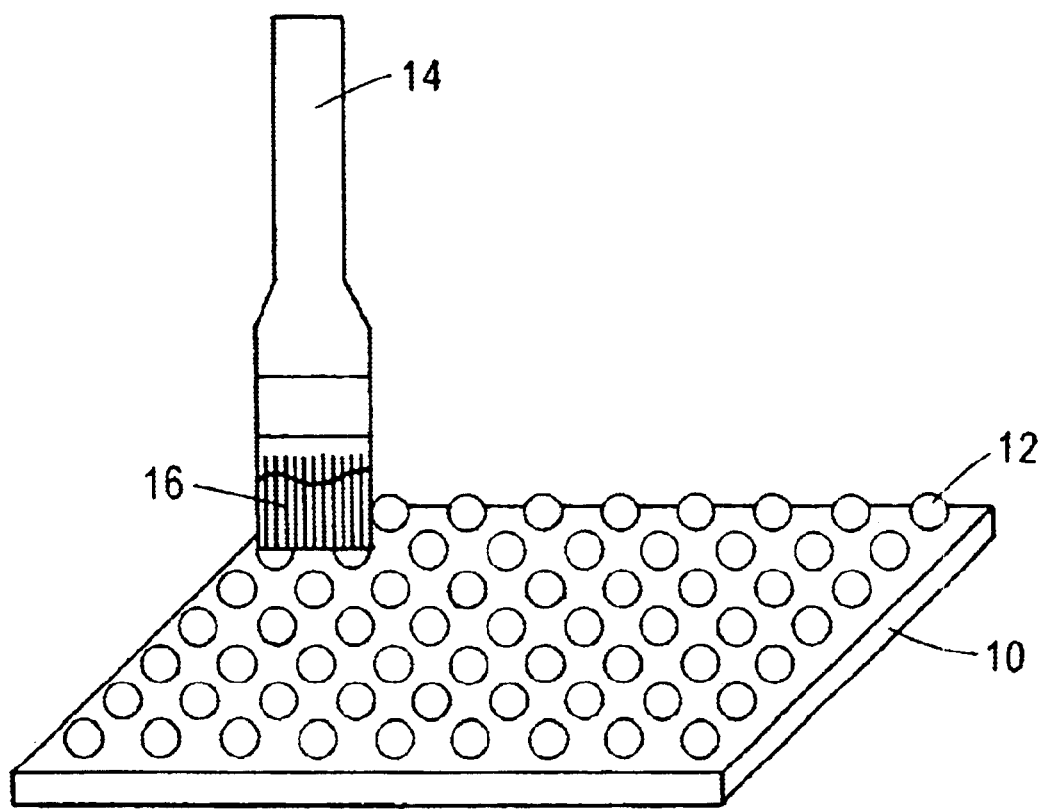
FIG. 1A depicts a prior method of depositing flux on a semiconductor chip, in which flux is sprayed over the surface of the semiconductor chip.
Figure 1B:
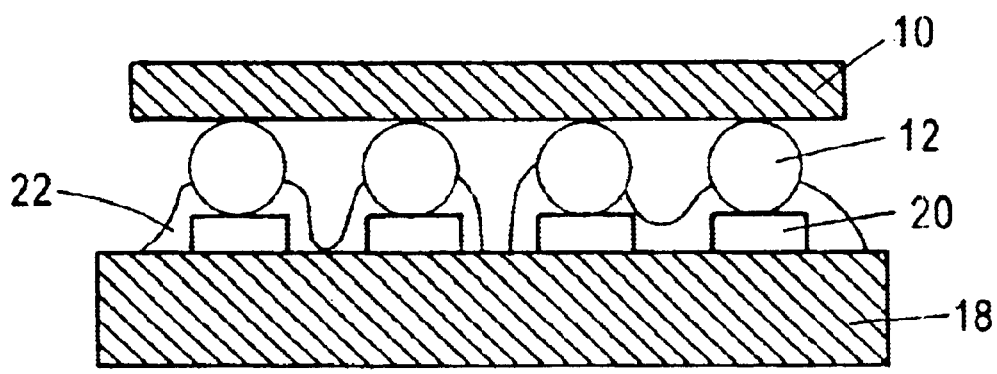
FIG. 1B depicts a cross-sectional view of a prior art flip-chip interconnection between a semiconductor and substrate, in which flux residue remains on the surface of the substrate.
Figure 2A:
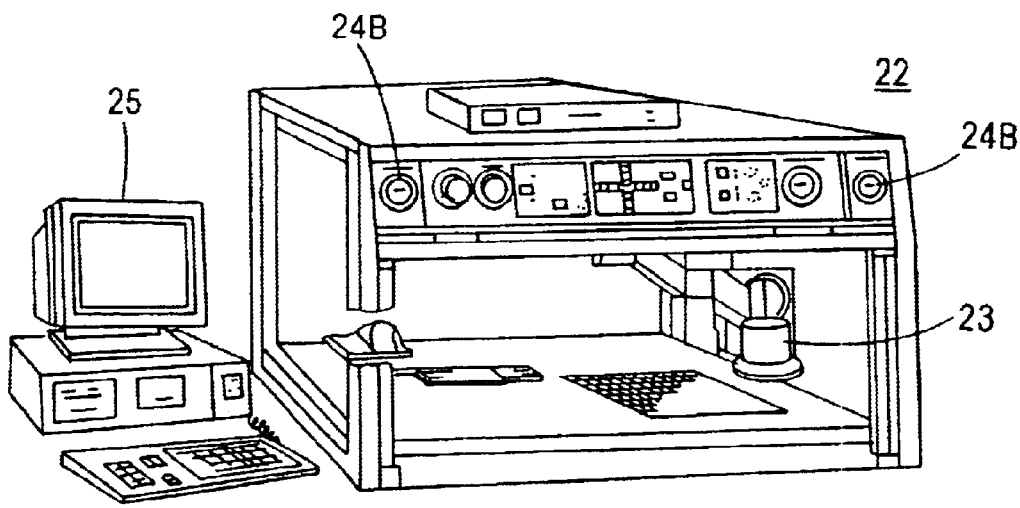
FIG. 2A depicts a front view of a flux dispenser, in accordance with an embodiment of the present invention.

With this in mind, FIG. 2A depicts a front view of a flux dispenser 22, in accordance with the present invention, which dispenses flux on a substrate 26. The substrate 26 can be a printed circuit board having a plurality of conductive terminals arranged on the surface thereof or a plurality of flip-chip type electrical components having a plurality of flip-chip solder bumps and arranged in a matrix. The flux dispenser 22 is equipped with a dispense head 23 which sprays flux over the substrate 26 via a flux nozzle attached thereto. In order to significantly reduce the flux residue during a subsequent high temperature solder reflow environment, according to the present invention, flux having a viscosity range between about 10 centipoises and about 150 centipoises is sprayed over the substrate 26 at a valve pressure between about 1.5 psi and about 30 psi, by using the flux dispenser 22. Particularly, it was experimentally observed that, when the flux is sprayed at a viscosity range between about 30 centipoises and about 150 centipoises, the optimum result is obtained.

Thus, according to the present invention, flux having the viscosity range between about 10 centipoises and about 150 centipoises is contained in a flux fluid chamber (not shown) included in the dispense head 23, and the flux is sprayed over the substrate 26 at a valve pressure between about 1.5 psi and about 30 psi via the flux nozzle. To maintain the specific valve pressure, the flux in the flux fluid chamber is maintained at a fluid pressure range between about 0.5 psi and about 30 psi.

Accordingly to an embodiment of the present invention, a flux needle is used as the flux nozzle because of its ability to accurately apply flux in an amount as low as one microliter, thereby resulting in minimal fluid dead volume in the dispensing valve and clean and sharp fluid cutoff by the positive cutoff action. In accordance with a particular embodiment of the present invention, the flux needle has a diameter range between about 0.1 mm to about 0.6 mm and a needle opening of the flux needle has a diameter range between about 5 micron to about 60 micron.

The flux dispenser 22 is further equipped with various control devices, for example, a fluid pressure gauge 24A for controlling the fluid pressure of flux contained in the flux fluid chamber, and a valve pressure gauge 24B, for controlling the valve pressure of flux sprayed out from the flux nozzle, e.g., a flux needle. Depending on the configuration of the substrate 26, e.g., diameter and height of a conductive terminal, distance between two neighboring conductive terminals on the substrate, the flux dispenser sprays flux on the substrate 26 at various valve pressures within the prescribed range between about 1.5 psi and about 30 psi via the flux needle. Accordingly, in accordance with the present invention, it is possible to controllably spray flux on the substrate 26 depending on the configuration of the substrate 26.

Figure 2B:
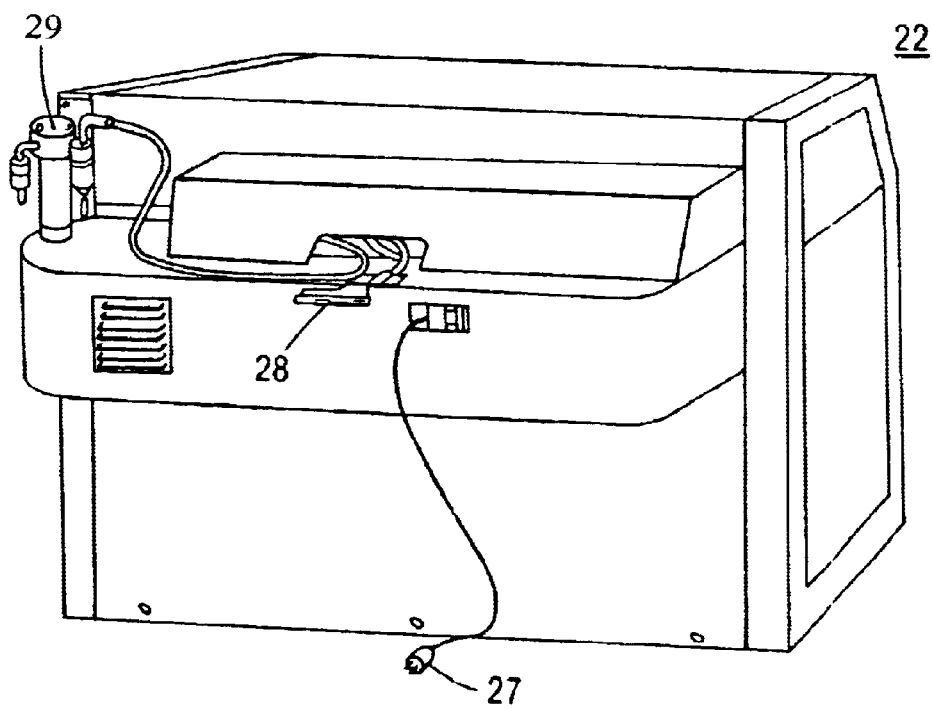
FIG. 2B depicts a rear view of the flux dispenser of FIG. 2A.

FIG. 2B depicts a rear view of the flux dispenser 22 shown in FIG. 2A. As depicted, the flux dispenser 22 is further equipped with a main air pressure supply 29, which maintains the main pressure of the flux dispenser 22 at a pressure range between about 60 psi and about 100 psi, thereby maintaining the fluid pressure and the valve pressure at the prescribed pressure ranges. A power supply line 27 and an interface port 28 are also provided to the flux dispenser 22. Particularly, the interface port 28 is provided for exchanging flux dispensing control data with a data processing device, e.g., a workstation 25 in FIG. 2A. For example, one can transform a specific fluid pressure and valve pressure corresponding to a certain configuration of the substrate 26 to computer-recognizable data, and save this data in the workstation 25. By using an input device, e.g., keyboard or mouse, to recognize a particular configuration of the substrate 26 to be processed, the workstation 25 generates a control command for the flux dispenser 22 to select a predetermined valve pressure or fluid pressure, thereby reducing the processing time and increasing the accuracy of the flux dispensing process.

Figure 3A:
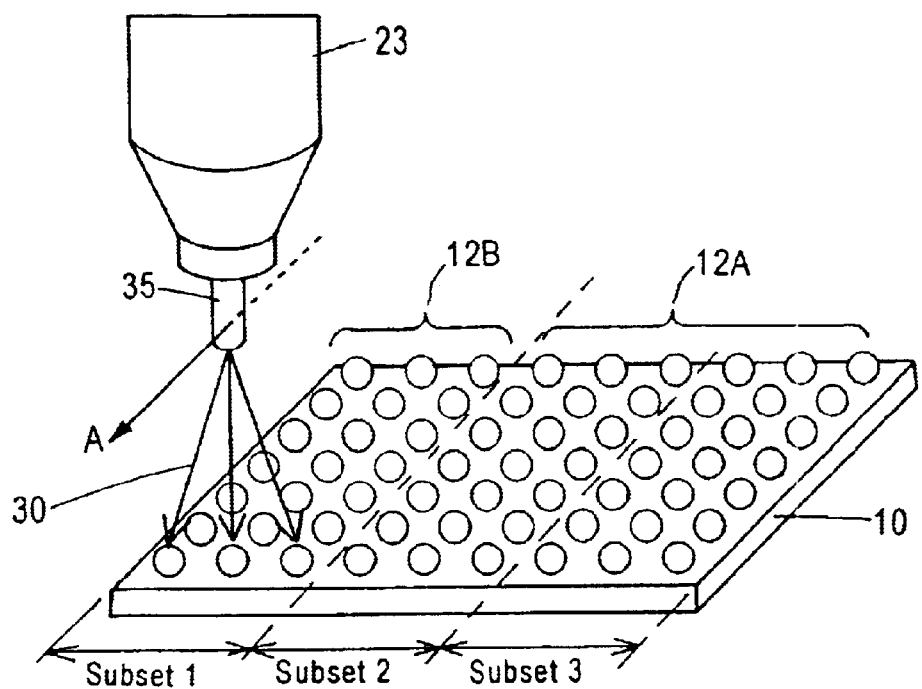
FIG. 3A depicts a method of controllably dispensing flux on a substrate having a plurality of conductive terminals evenly arranged on the surface thereof, in which flux having a certain viscosity range is sprayed over the substrate at a certain valve pressure range by a flux dispenser equipped with a flux needle, in accordance with an embodiment of the present invention.
Figure 3B:
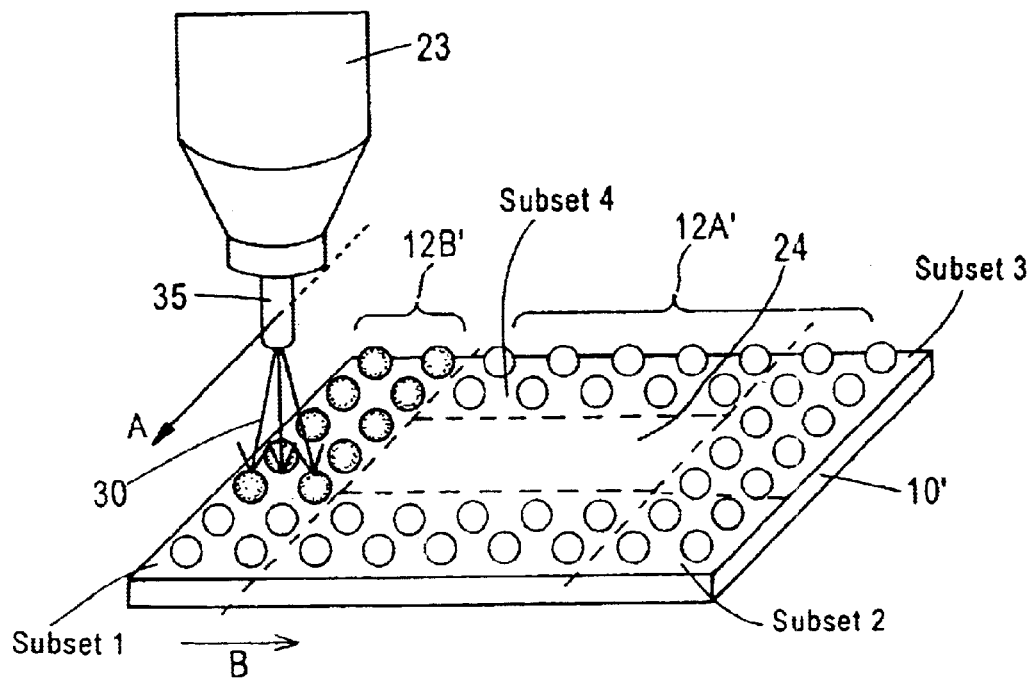
FIG. 3B depicts a method of selectively dispensing flux on a substrate having a plurality of conductive terminals unevenly arranged on the surface thereof, in which flux having a certain viscosity range is sprayed over the substrate at a certain valve pressure range by a flux dispenser equipped with a flux needle, in accordance with an embodiment of the present invention.

For example, as depicted in FIGS. 3A and 3B, flux is selectively sprayed over a substrate, depending on the arrangement of the conductive terminals on the substrate. FIG. 3A depicts a flux dispensing step in which flux 30 is sprayed over a flip-chip 10 positioned on a predetermined location and having a plurality of flip-chip bumps 12A, 12B evenly arranged on the surface of the flip-chip 10. The configuration of the flip-chip 10, e.g., flip-chip size, number of flip-chip bumps on the surface, location, height and diameter of each flip-chip bump, and etc., is usually easily acquirable from the design specification of the flip-chip 10.

The acquired configuration of the flip-chip 10 is then transformed to computer-recognizable data, e.g., binary data, and stored in the workstation 25 in FIG. 2A. The workstation 25 analyzes the configuration and arrangement pattern of the flip-chip bumps 12A, 12B, and determines optimized flux dispensing parameters, e.g., optimum flux viscosity and valve pressure, within the viscosity range between about 10 centipoises and about 150 centipoises and the valve pressure between about 1.5 psi and about 30 psi, as described previously.

Also, the workstation 25 determines the optimum spray pattern for the flip-chip 10 based on the calculated optimum flux viscosity and valve pressure and the bumps to be sprayed. For example, the bumps may be divided into a plurality of subsets, each of the subsets comprising a plurality of flip-chip bumps closely located to each other, based on the configuration and arrangement pattern of the flip-chip bumps 12A, 12B. For example, FIG. 3A depicts a subset 1 comprising the flip-chip bumps 12B arranged in the first three columns. The flux 30 is dispensed in the spray pattern so that three flip-chip bumps at the top row in the subset 1 are initially sprayed by the flux dispenser 23. The flux dispenser 23 moves in direction A towards the bottom row, thereby selectively depositing flux on the flip-chip bumps 12B of the subset 1. Upon completing dispensing of flux 30 on a subset of flip-chip bumps 12B, the flux dispenser 23 moves to the next subset (2) of flip-chips (in the next three columns) to dispense the flux 30. Thus, since the flux dispenser 23 applies the flux on the substrate 10 in a sequential order from the subset 1 to the subset 3, a more accurate flux spray control is achieved as compared to spraying flux over the entire surface of the substrate 10.

FIG. 3B depicts a flux dispensing step for a flip-chip 10' having a different flip-chip bump arrangement and its corresponding flux dispensing step using the same workstation 25 in FIG. 2A and flux dispenser 23. As shown, the flip-chip bumps 12A', 12B' are arranged in a manner such that no flip-chip bumps are arranged on a center square portion 24 of the surface of the flip-chip 10'. This configuration of the flip-chip 10' is also provided to and analyzed by the workstation 25 to determine optimized flux dispensing parameters, e.g., flux dispensing valve pressure, and flux viscosity, and a flux spray pattern.

For example, since no flip-chip bump is arranged on the center square portion 24 of the flip-chip 10', a first subset 1 is determined to comprise the flip-chip bumps 12B' on the first two columns thereof. In the same manner, a subset 2 comprises the flip-chip bumps 12A' on the last two rows, except for the first two columns, and a subset 3 comprises the flip-chip bumps 12A' on the last two columns except the last two rows. The flip-chip bumps 12A' on the first two rows constitute a subset 4 except bumps on the first two columns and the last two columns. The workstation 25 controls the flux dispenser 23 to start spraying the flux 30 on two flip-chip bumps 12B' on the first row of the subset 1, and then move to the direction A toward the bottom row. Upon completing dispensing flux on the subset 1, the workstation 25 commands the flux dispenser 23 to move to the subset 2 and to spray the flux 30 as moving to a direction B toward the last column of the flip-chip bumps 12A'. In the same manner, the flux 30 is supplied on the subsets 3 and 4. In this way, it is possible to avoid flux is dispensed on the center squire portion 24 of the flip-chip 10', thereby reducing wasted flux if sprayed over the entire surface of the flip-chip 10'.

Thus, in accordance with the present invention, flux having an optimized viscosity is selectively and controllably dispensed over the flip-chip bumps 12A', 12B' at an optimized flux dispensing valve pressure with an optimized flux spray pattern depending on the configuration of each target flip-chip. Further, since the flux dispensing parameters are calculated by and stored in the workstation 25 in FIG. 2A, the flux dispenser 23 is automatically controlled by the commands from the workstation 25 through the interface port 28 in FIG. 2B, thereby enabling accurate deposition of flux on the flip-chip.

Figure 4A:
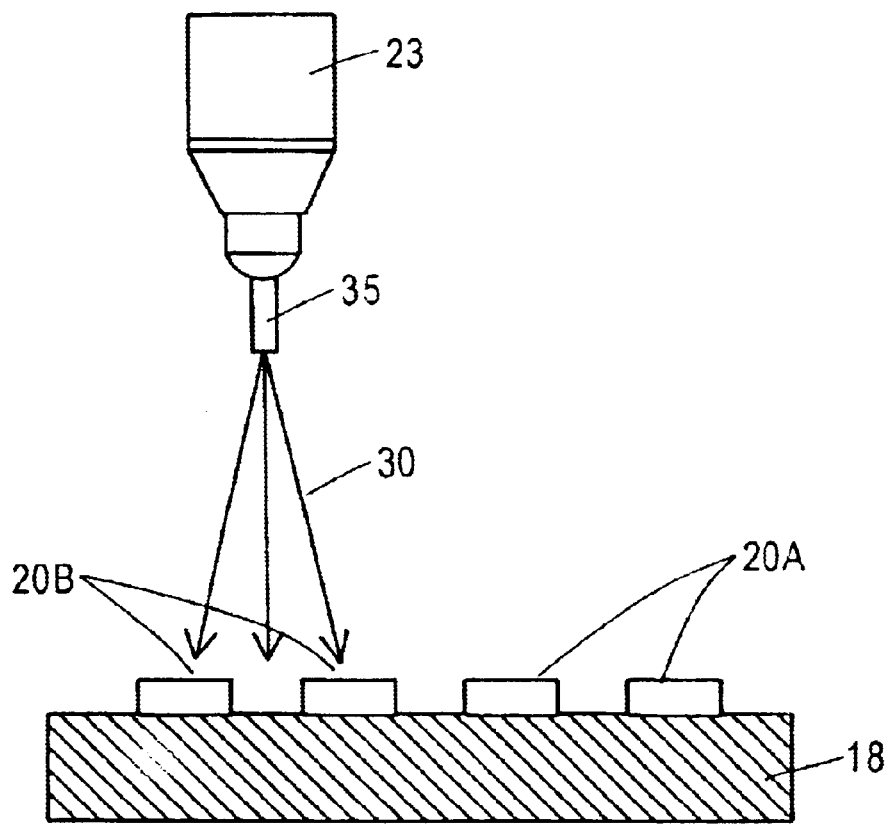
FIG. 4A depicts a method of selectively dispensing flux on a printed circuit board having a plurality of flip-chip pads on the surface thereof, in which flux having a certain viscosity range is sprayed over a selected subset of the flip-chip pads at a certain valve pressure range by a flux dispenser equipped with a flux needle, in accordance with an embodiment of the present invention.
Figure 4B:
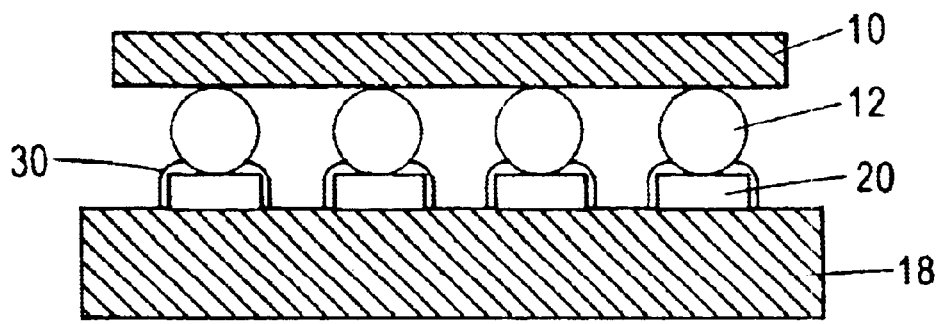
FIG. 4B depicts a cross-sectional view of a flip-chip interconnection between the printed circuit board of FIG. 4A and a flip-chip after the high temperature solder reflow process, in accordance with an embodiment of the present invention.

FIG. 4A depicts a flux-dispensing step in which flux is sprayed over a printed circuit board 18 having a plurality of flip-chip pads 20A, 20B arranged thereon. As previously described, flux 30 having a viscosity range between 10 centipoises and about 150 centipoises is sprayed over the printed circuit board 18 and the flip-chip pads 20 at a valve pressure between about 1.5 psi and about 30 psi via a flux needle 35 of a flux dispenser 23. Since the prescribed ranges of the flux viscosity and valve pressure significantly reduces residue problems under the high temperature solder reflow environment, as depicted in FIG. 4B, the flux 22 is mostly removed by thermal decomposition to volatile species, especially from the surface of the printed circuit board 18 between the flip-chip pads 20, thereby significantly reducing flux residue remaining on the surface of the printed circuit board 18.

Figure 5A:
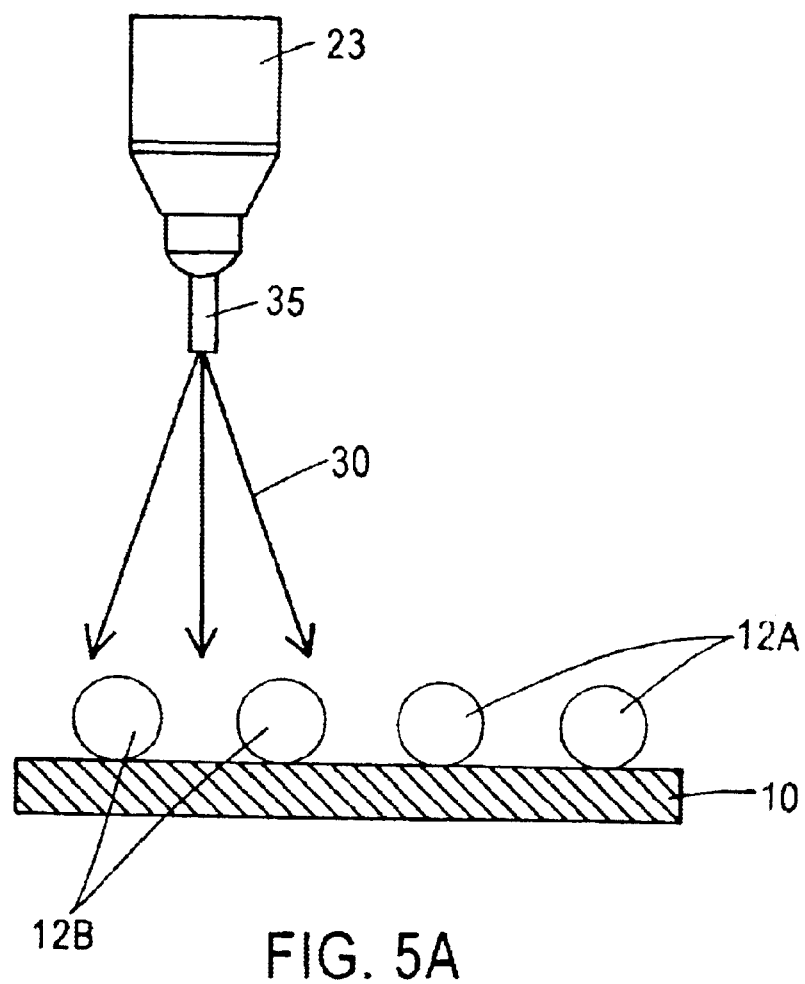
FIG. 5A depicts a method of selectively dispensing flux on a flip-chip having a plurality of flip-chip bumps on the surface thereof, in which flux having a certain viscosity range is sprayed over a selected subset of the flip-chip bumps at a certain valve pressure range by a flux dispenser equipped with a flux needle, in accordance with an embodiment of the present invention.
Figure 5B:
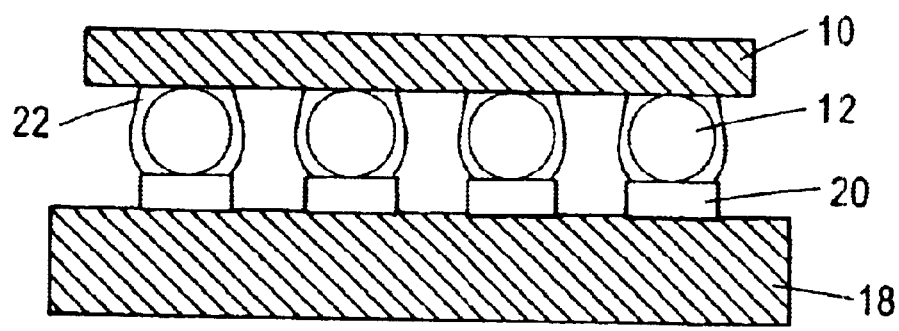
FIG. 5B depicts a cross-sectional view of a flip-chip interconnection between a substrate and the flip-chip of FIG. 5A after the high temperature solder reflow process, in accordance with an embodiment of the present invention.

Similarly, FIG. 5A depicts a flux dispensing step in which flux 30 having a viscosity range between 10 centipoises and about 150 centipoises is sprayed over a flip-chip having a plurality of flip-chip bumps 12A, 12B thereon at a valve pressure between about 1.5 psi and about 30 psi via a flux needle 35 of a flux dispenser 23. As depicted in FIG. 5B, since the prescribed ranges of the flux viscosity and valve pressure significantly reduces residue problems under the high temperature solder reflow environment, the flux 30 is mostly removed by thermal decomposition to volatile species, especially from the surface of the flip-chip 10 between the flip-chip bumps 12, thereby significantly reducing flux residue remaining on the surface of the flip-chip 10. Thus, according to the present invention, an accurate control of the flux dispensing step is achieved on various kinds of substrates, e.g., a flip-chip or a printed circuit board.

Accordingly, the present invention significantly reduces flux residue remaining on a surface of a substrate after a subsequent high temperature solder reflow process, thereby reducing problems caused by flux residue, i.e., the device's functional failure during long term use due, and risk C4 fatigue life and C4 reliability during production on-off cycle. Also, the present invention enables an accurate control of the flux dispensing process by using a flux dispensing data control device. Further, the present invention reduces manufacturing cost and time because no subsequent process for cleaning flux residue is required.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. An apparatus for dispensing flux on a substrate having a plurality of conductive terminals thereon, the apparatus comprising:

a data processing device configured to control valve pressure, flux viscosity, and flux spray pattern based on a configuration of the substrate and an arrangement pattern of conductive terminals thereon; and a flux dispense nozzle configured for spraying flux on the conductive terminals, wherein the data processing device controls the flux viscosity in a range between about 10 centipoises and about 150 centipoises and controls the valve pressure for spraying the flux in a range between about 1.5 psi and about 30 psi.

2. The apparatus of claim 1, wherein the data processing device controls movement of the flux dispense nozzle in at least two dimensions relative to the substrate and decides a plurality of subsets based on the configuration of the substrate and the arrangement pattern of conductive terminals thereon, each subset comprising a plurality of conductive terminals closely located to each other.

3. The apparatus of claim 2, the data processing device controls the apparatus to selectively spray the flux on each subset sequentially.

4. The apparatus of claim 1, wherein the flux nozzle is a flux needle.

5. An apparatus for dispensing flux on a substrate having a plurality of conductive terminals thereon, the apparatus comprising:

a data processing device adapted for controlling valve pressure, flux viscosity, and flux spray pattern based on a configuration of the substrate and an arrangement pattern of conductive terminals thereon; and a flux dispense needle configured for spraying flux on the conductive terminals, wherein the data processing device controls the flux viscosity in a range between about 10 centipoises and about 150 centipoises and controls the valve pressure for spraying the flux in a range between about 1.5 psi and about 30 psi, and the flux needle has a diameter range between about 0.1 mm to about 0.6 mm.

6. The apparatus of claim 5, wherein the flux needle has a needle opening having a diameter range between about 5 microns and about 60 microns.

7. The apparatus of claim 1, wherein the flux contained in the flux fluid chamber is maintained at a fluid pressure range between about 0.5 psi and about 30 psi.

8. The apparatus of claim 7, wherein a main pressure range of the apparatus for dispensing flux is maintained at a pressure range between about 60 psi and about 100 psi to maintain the valve pressure range and the flux pressure range.

9. The apparatus of claim 1, wherein the substrate is a printed circuit board and the plurality of conductive terminals are flip-chip pads arranged on the printed circuit board.

10. The apparatus of claim 1, wherein the substrate is a flip-chip type electrical component and the plurality of conductive terminals are flip-chip bumps arranged on the flip-chip type electrical component.

* * * * *